(12) United States Patent
Taniguchi et al.

(10) Patent No.: US 9,076,832 B2
(45) Date of Patent: ***Jul. 7, 2015

(54) WAFER PROCESSING TAPE, METHOD OF MANUFACTURING WAFER PROCESSING TAPE, AND METHOD OF MANUFACTURING SEMICONDUCTOR DEVICE

(75) Inventors: Kouhei Taniguchi, Ichihara (JP); Takayuki Matsuzaki, Ichihara (JP); Shinya Katou, Ichihara (JP); Kouji Komorida, Ichihara (JP); Michio Mashino, Ichihara (JP); Tatsuya Sakuta, Ichihara (JP); Rie Katou, Ichihara (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/274,288

(22) Filed: Oct. 14, 2011

(65) Prior Publication Data

US 2012/0094471 A1    Apr. 19, 2012

Related U.S. Application Data

(60) Provisional application No. 61/446,987, filed on Feb. 25, 2011.

(30) Foreign Application Priority Data

Oct. 15, 2010    (JP) ............................... P2010-232726

(51) Int. Cl.
*H01L 21/00*    (2006.01)
*H01L 21/683*    (2006.01)
(Continued)

(52) U.S. Cl.
CPC ....... *H01L 21/6836* (2013.01); *Y10T 156/1052* (2015.01); *Y10T 156/10* (2015.01);
(Continued)

(58) Field of Classification Search
CPC .................................................. H01L 21/6836
USPC .......... 257/798, E21.599; 438/113, 114, 460, 438/464
See application file for complete search history.

(56) References Cited

FOREIGN PATENT DOCUMENTS

| CN | 101040023 | 9/2007 |
| CN | 101814432 | 8/2010 |

(Continued)

OTHER PUBLICATIONS

English translation of International Preliminary Report on Patentability from International Patent Application No. PCT/JP2011/073436, transmitted May 16, 2013.

(Continued)

*Primary Examiner* — Robert Huber
(74) *Attorney, Agent, or Firm* — Fitch, Even, Tabin & Flannery LLP

(57) ABSTRACT

In a wafer processing tape, circular or tongue-shaped notched parts facing the center of an adhesive layer, as seen in a plan view, are formed so as to correspond to a pasting region to a wafer ring to a depth that reaches a release base material from the side of a base material film. Due to the formation of the notched parts, when a peeling force acts on the wafer processing tape, portions of a tacky material layer and the base material film which are more outward than the notched parts are peeled off first, and a portion that is more inward than the notched parts remains on the wafer ring in a protruding state. Accordingly, a peeling strength between the wafer processing tape and the wafer ring can be increased. Methods of manufacturing the tape and a semiconductor device are also provided.

6 Claims, 16 Drawing Sheets

(51) Int. Cl.
*H01L 21/56* (2006.01)
*H01L 21/67* (2006.01)
*H01L 23/31* (2006.01)
*H01L 21/78* (2006.01)

(52) U.S. Cl.
CPC ......... *Y10T428/1476* (2015.01); *H01L 21/568* (2013.01); *H01L 21/67132* (2013.01); *H01L 23/3135* (2013.01); *H01L 21/78* (2013.01); *H01L 2924/0002* (2013.01)

(56) References Cited

FOREIGN PATENT DOCUMENTS

| | | | |
|---|---|---|---|
| JP | 2003218191 A | * | 7/2003 |
| JP | 2005-350520 A | | 12/2005 |
| JP | 2006-111727 A | | 4/2006 |
| JP | 2007-242726 A | | 9/2007 |
| JP | 2008-153587 A | | 7/2008 |
| JP | 2008153587 A | * | 7/2008 |
| JP | 2009-88480 A | | 4/2009 |
| JP | 2009-218397 A | | 9/2009 |
| JP | 2010-192856 A | | 9/2010 |
| JP | 2010192856 A | * | 9/2010 |
| TW | 200939364 | | 9/2009 |
| TW | 2010-36054 A | | 10/2010 |

OTHER PUBLICATIONS

CN Office Action of Appln. No. 201180048659.9 dated Feb. 2, 2015.

* cited by examiner

Fig.3
(a)
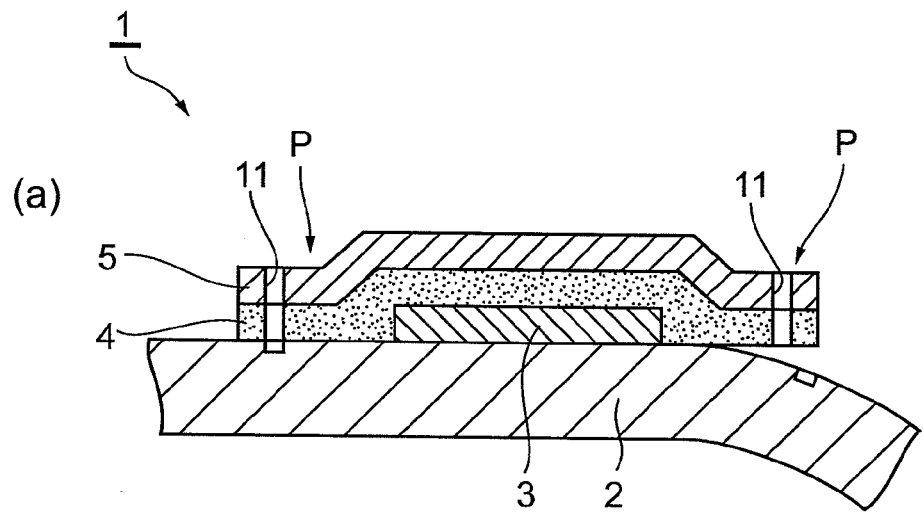
(b)
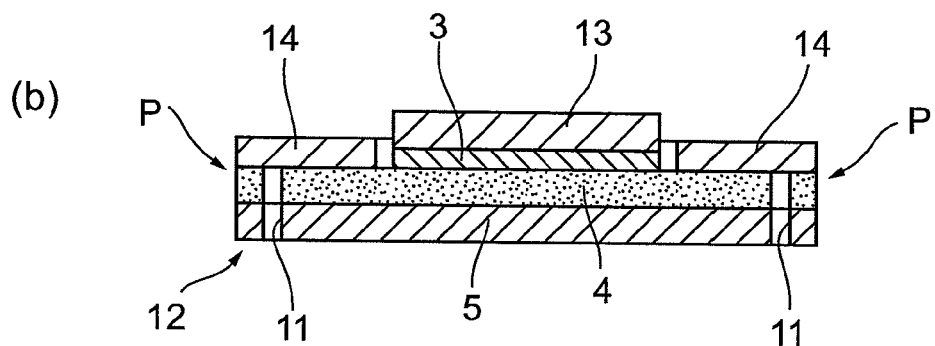

WAFER PROCESSING TAPE, METHOD OF MANUFACTURING WAFER PROCESSING TAPE, AND METHOD OF MANUFACTURING SEMICONDUCTOR DEVICE

CROSS-REFERENCE TO RELATED APPLICATION

This application claims priority to Provisional Application No. 61/446,987 filed on Feb. 25, 2011 by the same Applicant, which is hereby incorporated by reference in its entirety.

BACKGROUND OF THE INVENTION

1. Field of the Invention

The present invention relates to a wafer processing tape used for dicing of a semiconductor wafer and for die bonding of a semiconductor chip obtained by dicing or the like, a method of manufacturing the wafer processing tape, and a method of manufacturing a semiconductor device using the wafer processing tape.

2. Related Background Art

In recent years, there has been a rapid increase in demands for a wider range of functions, lighter weight, and smaller sizes in mobile-related devices. Accordingly, there has been a stronger need for high-density packaging of semiconductor chips. In particular, development has been focused on stacked multi-chip packages in which semiconductor chips are laminated. In some stacked multi-chip packages, semiconductor chips are laminated and bonded to each other in a die bonding process. The introduction of a wafer processing tape that can be used to fix a semiconductor wafer in a dicing process or used concomitantly for bonding a semiconductor chip to a lead frame or the like in a die bonding process is being promoted in manufacturing processes of such semiconductor chips (for example, refer to Japanese Patent Publication No. 2009-88480).

When fabricating such a wafer processing tape, first, an adhesive film comprising an adhesive layer formed on a release base material and a dicing film comprising a tacky material layer formed on a base material film are prepared and then pasted together with the adhesive layer and the tacky material layer facing each other. Next, the base material film, the adhesive layer, and the tacky material layer are pre-cut in accordance with a wafer shape to obtain a wafer processing tape with a desired shape.

SUMMARY OF THE INVENTION

When processing a semiconductor wafer using such a wafer processing tape, generally, a wafer ring is arranged around the semiconductor wafer and the wafer processing tape is pasted to the wafer ring. At this point, if the peeling strength between the wafer processing tape and the wafer ring is insufficient, the wafer processing tape peels off from the wafer ring during respective processes such as the dicing process and the die bonding process, and may adversely affect implementation of the processes.

The present invention has been made in order to solve the problems described above, and an object of the present invention is to provide a wafer processing tape capable of increasing a peeling strength with a wafer ring, a method of manufacturing the wafer processing tape, and a method of manufacturing a semiconductor device using the wafer processing tape.

In order to solve the problems described above, a wafer processing tape according to the present invention is a wafer processing tape to be used pasted to a wafer ring when processing a semiconductor wafer, the wafer processing tape comprising: a release base material that constitutes a base of the tape; an adhesive layer provided on one surface of the release base material so as to correspond to a planar shape of the semiconductor wafer; a tacky material layer provided so as to cover the adhesive layer; and a base material film provided so as to cover the tacky material layer, wherein regions of the tacky material layer and the base material film which protrude outward from the adhesive layer serve as a pasting region to the wafer ring, and at least one notched part defining a protruding portion facing the center of the adhesive layer as seen in a plan view is formed in the pasting region to a depth that reaches the release base material from the side of the base material film.

With this wafer processing tape, at least one notched part defining a protruding portion facing the center of the adhesive layer as seen in a plan view is formed so as to correspond to the pasting region to the wafer ring to a depth that reaches the release base material from the side of the base material film. Due to the formation of the notched part, when a peeling force acts on the wafer processing tape pasted on the wafer ring, portions of the tacky material layer and the base material film which are more outward than the notched part (outer portions) are peeled off first, and a portion that is more inward than the notched part (inner portion) remains on the wafer ring in a protruding state. As the peeling force further acts, the inner portion is pulled by the outer portions and attempts to peel off. However, due to an increase in a peeled area and the fact that a point of the pulling action is positioned further inward from the inner portion, a greater peeling force is required to peel off the inner portion. Therefore, with this wafer processing tape, a peeling strength between the wafer processing tape and the wafer ring can be increased.

In addition, a plurality of the notched parts are favorably arranged along the pasting region. In this case, the peeling strength between the wafer processing tape and the wafer ring can be further increased.

Furthermore, favorably, this wafer processing tape includes at least one notched part defining a protruding portion that faces away from the outside of the adhesive layer as seen in a plan view. In this case, a liquid that creates a peeling force such as a cooling water during dicing can be released from the protruding portions to the outside of the wafer processing tape. Therefore, the peeling strength between the wafer processing tape and the wafer ring can be further ensured.

Moreover, favorably, the notched parts do not penetrate the release base material. In this case, since the notched parts are prevented from acting when peeling off the release base material during the use of the wafer processing tape, the release base material can readily be peeled off.

In addition, favorably, if a denotes a thickness of the release base material and d denotes a depth of the notched parts, then $0 < d/a \le 0.7$ is satisfied. By satisfying this condition, an effect of the notched parts can be sufficiently exerted.

Furthermore, a method of manufacturing a wafer processing tape according to the present invention is a method of manufacturing a wafer processing tape that is used pasted to a wafer ring when processing a semiconductor wafer, the method comprising: providing an adhesive film formed of a release base material that constitutes a base of the tape and an adhesive layer provided on one surface of the release base material so as to correspond to a planar shape of the semiconductor wafer; providing a tacky film comprising a base material film and a tacky material layer provided on one surface of the base material film; pasting the adhesive film and the tacky film such that the adhesive layer and the tacky material layer face each other; and forming at least one notched part defining a protruding portion facing the center of the adhesive layer as seen in a plan view, the at least one notched part being formed in a pasting region of the tacky film that protrudes outward from the adhesive layer and is configured for pasting to the wafer ring, the at least one notched part further being formed, to a depth that reaches the release base material from the side of the base material film.

With a wafer processing tape obtained by this manufacturing method, at least one notched part defining a protruding portion facing the center of the adhesive layer as seen in a plan view is formed so as to correspond to the pasting region to the wafer ring to a depth that reaches the release base material from the side of the base material film. Due to the formation of the notched part, when a peeling force acts on the wafer processing tape pasted on the wafer ring, portions of the tacky material layer and the base material film which are more outward than the notched part (outer portions) are peeled off first, and a portion that is more inward than the notched part (inner portion) remains on the wafer ring in a protruding state. As the peeling force further acts, the inner portion is pulled by the outer portions and attempts to peel off. However, due to an increase in a peeled area and the fact that a point of the pulling action is positioned further inward from the inner portion, a greater peeling force is required to peel off the inner portion. Therefore, with this wafer processing tape, a peeling strength between the wafer processing tape and the wafer ring can be increased.

In addition, a plurality of the notched parts are favorably formed within the pasting region. In this case, the peeling strength between the wafer processing tape and the wafer ring can be further increased.

Furthermore, the method of manufacturing a wafer processing tape according to the present invention is favorably further comprising forming at least one notched part defining a protruding portions that faces away from the outside of the adhesive layer as seen in a plan view. In this case, a liquid that creates a peeling force such as a cooling water during dicing can be released from the protruding portions to the outside of the wafer processing tape. Therefore, the peeling strength between the wafer processing tape and the wafer ring can be further ensured.

In addition, the notched parts are favorably formed so as not to penetrate the release base material. In this case, since the notched parts are prevented from acting when peeling off the release base material during the use of the wafer processing tape, the release base material can readily be peeled off.

Furthermore, the notched parts are favorably formed such that if a denotes a thickness of the release base material and d denotes a depth of the notched parts, then $0<d/a\le0.7$ is satisfied. By satisfying this condition, an effect of the notched parts can be sufficiently exerted.

Moreover, a method of manufacturing a semiconductor device according to the present invention is a method of manufacturing a semiconductor device using the wafer processing tape described above, the method comprising: fixing a film laminate obtained by peeling off the release base material from the wafer processing tape to one surface of a semiconductor wafer via the adhesive layer; fixing the wafer ring to the pasting region via the tacky material layer in the pasting region of the film laminate; and dicing the semiconductor wafer while supplying cooling water to a dicing blade.

According to this method of manufacturing a semiconductor device, since a peeling strength between the wafer processing tape and the wafer ring can be sufficiently ensured, the wafer processing tape can be suppressed from becoming peeled off from the wafer ring during processes. Therefore, workability can be improved and a fabrication yield of the semiconductor device can be ensured.

According to the present invention, a peeling strength with a wafer ring can be improved. In addition, a fabrication yield of the semiconductor device can be ensured.

BRIEF DESCRIPTION OF THE DRAWINGS

FIG. 3 is a diagram showing a method of mounting the wafer processing tape to a wafer ring;

DESCRIPTION OF THE PREFERRED EMBODIMENTS

Hereinafter, preferred embodiments of a wafer processing tape, a method of manufacturing the wafer processing tape, and a method of manufacturing a semiconductor device using the wafer processing tape according to the present invention will be described in detail with reference to the drawings.

[Configuration of Wafer Processing Tape]

Figure 1:
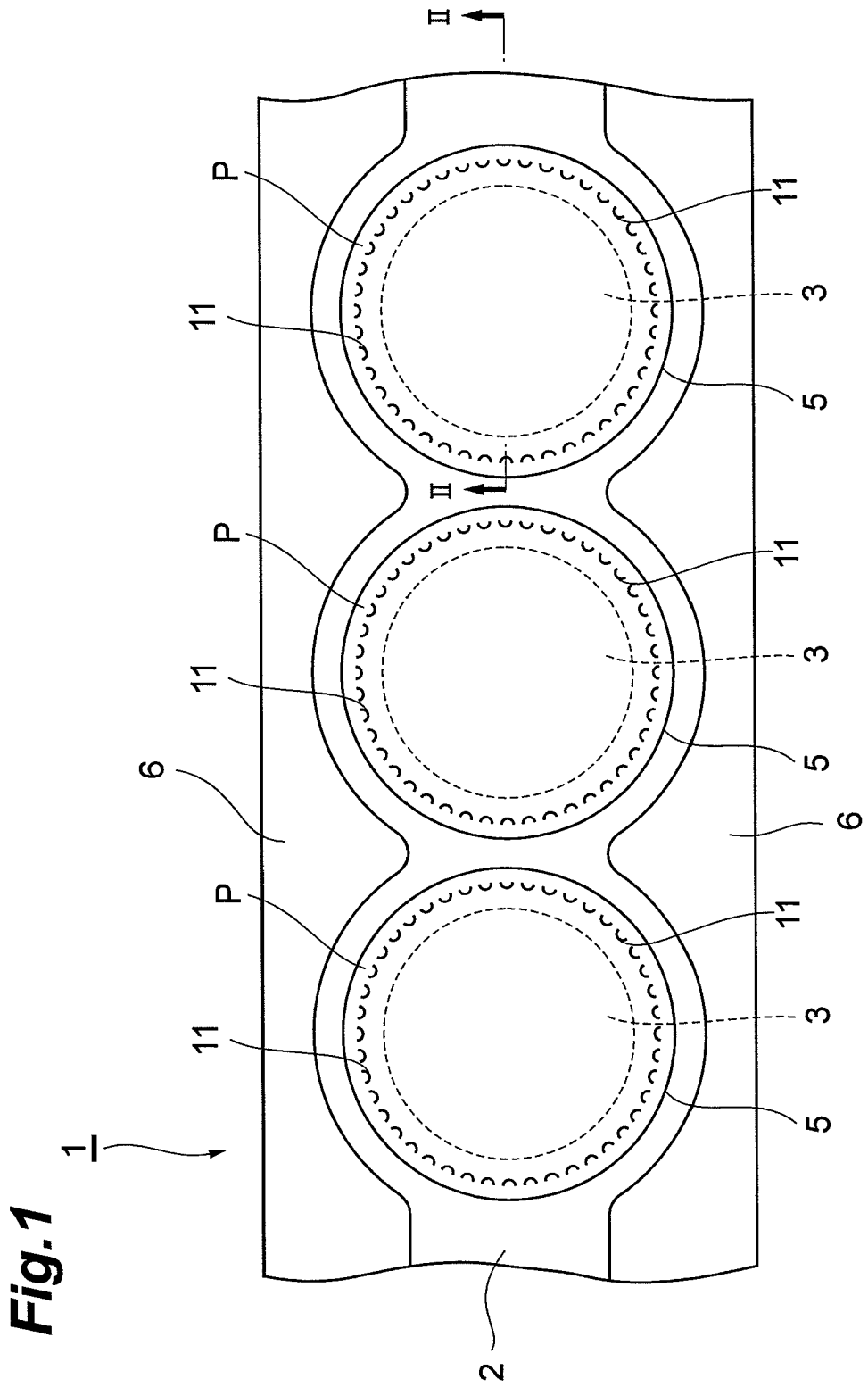
FIG. 1 is a plan view showing an embodiment of a wafer processing tape according to the present invention.
Figure 2:
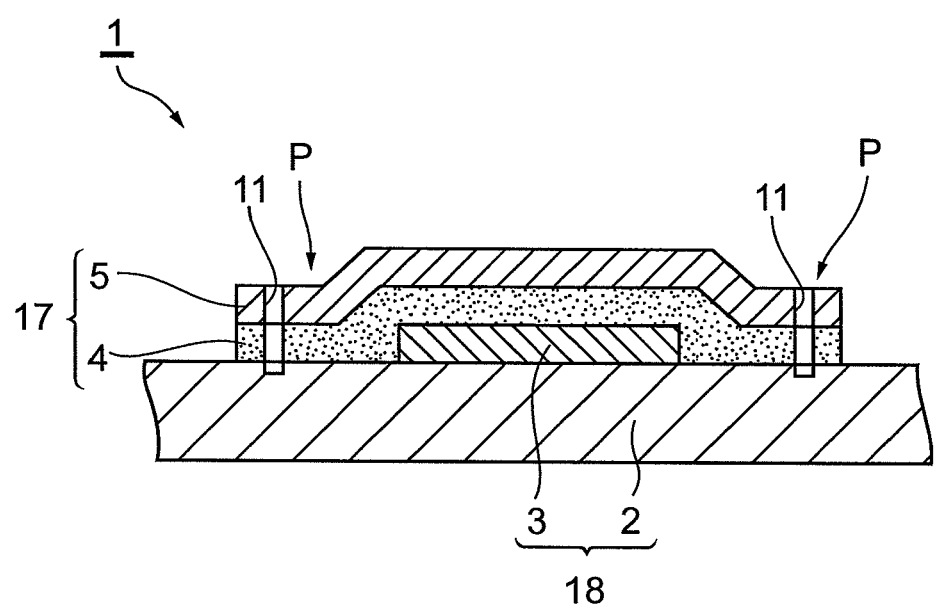
FIG. 2 is a cross-sectional view taken along II-II in FIG. 1.

FIG. 1 is a plan view showing an embodiment of a wafer processing tape according to the present invention. In addition, FIG. 2 is a cross-sectional view taken along II-II in FIG. 1. A wafer processing tape 1 in FIGS. 1 and 2 is a long tape used for dicing of a semiconductor wafer and for die bonding of a semiconductor chip obtained by dicing, and is normally wound into a roll.

As shown in FIGS. 1 and 2, the wafer processing tape 1 has been precut and comprises: a release base material 2 that constitutes a base of the tape; an adhesive layer 3 circularly provided at regular intervals on one surface of the release base material 2 so as to correspond to the shape of a semiconductor wafer; a tacky material layer 4 circularly provided so as to cover the adhesive layer 3; and a base material film 5 provided in the same shape as the tacky material layer 4 so as to cover the tacky material layer 4. Embankments 6 arranged at regular intervals from the circular tacky material layer 4 and the base material film 5 are provided at both edges in a width-direction of the release base material 2. The embankments 6 are formed during pre-cutting of the tacky material layer 4 and the base material film 5. Moreover, the release base material 2 and the adhesive layer 3 are formed by an adhesive film 18 to be described later, and the base material film 5 and the tacky material layer 4 are formed by a tacky film 17 to be described later.

Among ends of the tacky material layer 4 and the base material film 5, regions protruding outward than the adhesive layer 3 constitute a pasting region P to the wafer ring. A plurality of notched parts 11 formed with a depth that reaches the release base material 2 from the side of the base material film 5 is arranged in an annular pattern in the pasting region P. As illustrated in FIG. 1, the notched parts 11 have a circular or tongue-like shape as seen in a plan view, and are formed oriented such that protrusions of the notched parts 11 are on a center side of the adhesive layer 3. The depths of the notched parts 11 are favorably set such that if a denotes a thickness of the release base material 2 and d denotes the depth of the notched parts, then $0<d/a\leq 0.7$ is satisfied and, at the same time, the release base material 2 is not penetrated. Moreover, while the number of notched parts 11 to be arranged is not particularly limited, for example, the notched parts 11 are favorably arranged at intervals of 2 to 3 degrees.

[Fabrication of Semiconductor Device]

Figure 4:
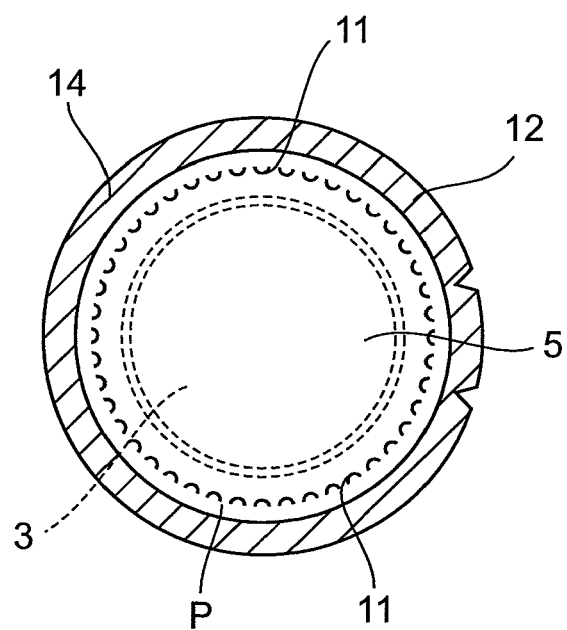
FIG. 4 is a diagram showing a mounted state of the wafer processing tape to a wafer ring.

When manufacturing a semiconductor device using the wafer processing tape 1 described above, first, as shown in (a) of FIG. 3, the release base material 2 is peeled off from the wafer processing tape 1 to obtain a film laminate 12. Next, as shown in (b) of FIG. 3, the film laminate 12 is fixed to one surface of a semiconductor wafer 13 via the adhesive layer 3 exposed by the peeling of the release base material 2. In addition, as shown in (b) of FIG. 3 and in FIG. 4, a wafer ring 14 is fixed via the tacky material layer 4 in a pasting region P of the film laminate 12.

Figure 5:
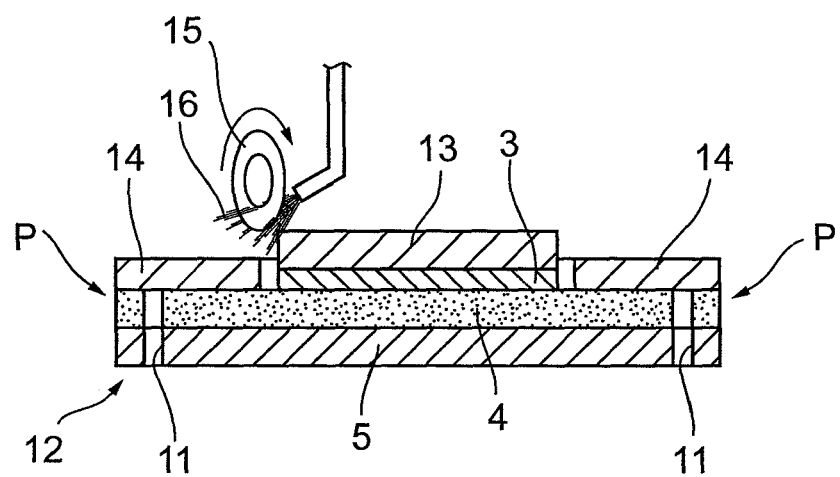
FIG. 5 is a diagram showing a dicing process of a semiconductor wafer.

Next, as shown in FIG. 5, dicing of the semiconductor wafer 13 and the adhesive layer 3 is performed while supplying cooling water 16 to a dicing blade 15. After dicing, the tacky material layer 4 is irradiated with high-energy rays to reduce a tack strength, and a semiconductor chip with the adhesive layer 3 is picked up from the base material film 5. Subsequently, by attaching the semiconductor chip to a predetermined supporting member via the adhesive layer 3, a semiconductor device is obtained.

When performing the dicing described above, the wafer processing tape 1 (film laminate 12) is subjected to pressure from the cooling water 16. Therefore, when the peeling strength between the wafer processing tape 1 and the wafer ring 14 is insufficient, the wafer processing tape 1 may peel off from the wafer ring 14 and may adversely affect dicing.

Figure 6:
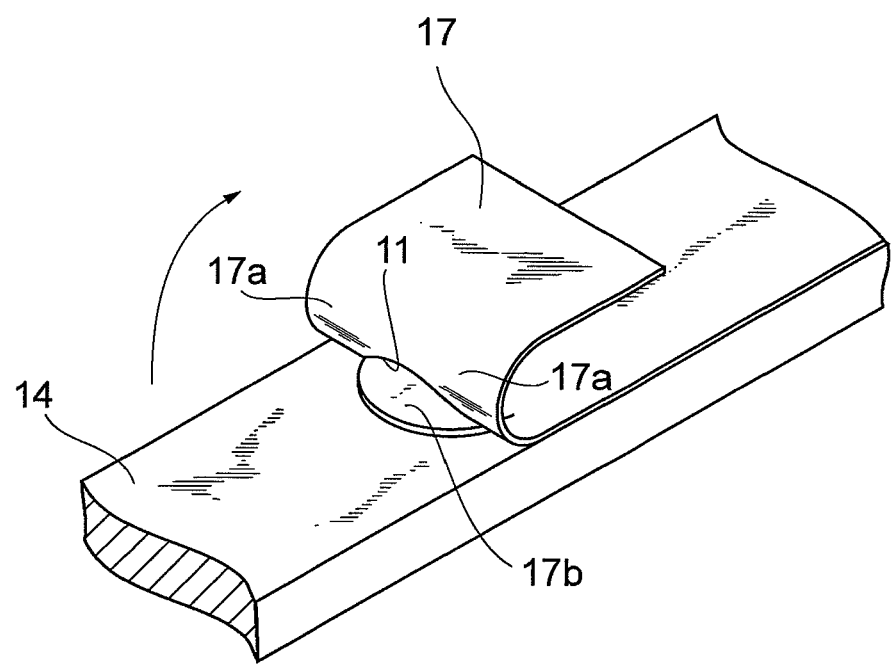
FIG. 6 is a perspective view showing an effect of notched parts.

In contrast, with the wafer processing tape 1, as shown in FIG. 1, circular or tongue-shaped notched parts 11 facing the center of the adhesive layer 3 as seen in a plan view are formed so as to correspond to the pasting region P to the wafer ring 14 to a depth that reaches the release base material 2 from the side of the base material film 5. Due to the formation of the notched parts 11, when a peeling force acts on the wafer processing tape 1 pasted on the wafer ring 14, as shown in FIG. 6, portions of the tacky material layer 4 and the base material film 5 which are more outward than the notched part 11 (outer portions 17a) are peeled off first, and a portion that is more inward than the notched parts 11 (inner portion or flap 17b) remains on the wafer ring 14 in a protruding state.

As the peeling force further acts, the inner portion 17b is pulled by the outer portions 17a and attempts to peel off. However, due to an increase in a peeled area and the fact that a point of the pulling action is positioned further inward than the inner portion 17b, a greater peeling force is required to peel off the inner portion 17b. Therefore, with this wafer processing tape 1, the peeling strength between the wafer processing tape 1 and the wafer ring 14 can be increased and the wafer processing tape 1 can be suppressed from becoming peeled off from the wafer ring 14 during processes. This contributes toward improving workability, and an improvement of a fabrication yield of the semiconductor device can be achieved. Moreover, the tacky film 17 is not limited to an ultraviolet-curable film and a pressure-sensitive film can also be used. Since peeling from the wafer ring 14 is more likely to occur with a pressure-sensitive film, the formation of the notched parts 11 described above is particularly useful.

In addition, with the wafer processing tape 1, the depths of the notched parts 11 are set such that if a denotes a thickness of the release base material 2 and d denotes the depth of the notched parts, then $0<d/a\leq 0.7$ is satisfied and, at the same time, the release base material 2 is not penetrated. Accordingly, an effect of the notched parts 11 can be sufficiently exerted. In addition, since the notched parts 11 are prevented from acting when peeling off the release base material 2 during the use of the wafer processing tape 1, the release base material 2 can readily be peeled off.

[Fabrication of Wafer Processing Tape]

To fabricate the wafer processing tape 1, for example, SD-3004 manufactured by Hitachi Chemical Co., Ltd. is prepared as the tacky film 17 constituted by the tacky material layer 4 and the base material film 5. In addition, for example, the HS-270 series manufactured by Hitachi Chemical Co., Ltd. is prepared as the adhesive film 18 constituted by the adhesive layer 3 and the release base material 2. Next, circular pre-cutting to a diameter of 320 mm of the adhesive film 18 is performed so that a notching depth to the release base material 2 is equal to or less than 20 um in order to remove unnecessary portions of the adhesive layer 3. Subsequently, the tacky material layer 4 and the adhesive layer 3 are arranged so as to face each other to paste together the adhesive film 18 and the tacky film 17 at conditions of room temperature, a linear pressure of 1 kg/cm, and a speed of 0.5 m/minute. Next, circular pre-cutting to a diameter of 390 mm of the tacky film 17 is performed concentrically with the adhesive layer 3 so that a notching depth to the release base material 2 is equal to or less than 20 um in order to remove unnecessary portions of the tacky material layer 4 and the base material film 5 and to form the embankments 6. After pre-cutting the tacky film 17, using a predetermined die, circular or tongue-shaped notched parts 11 are formed arranged in an annular pattern at positions approximately 5 mm inward from an edge of the tacky film 17 to obtain the wafer processing tape 1.

[Evaluation of Peeling Strength]

A wafer processing tape (comparative example) on which the notched parts 11 are not formed was fabricated separate to the wafer processing tape 1 (example) obtained by the manufacturing method described above. Subsequently, a first test specimen was fabricated by cutting off a rectangular region having a width of 10 mm and a length of 50 mm and including one notched part 11 from the example tape, and after peeling off the release base material 2, laminating the tacky material layer 4 washed by ethanol and the base material film 5 onto a surface of an adherend (SUS 304) at room temperature. In addition, a second test specimen was fabricated by cutting off a region similar to the rectangular region described above from the comparative example tape, and after peeling off the release base material 2, laminating the tacky material layer 4 washed by ethanol and the base material film 5 onto a surface of an adherend (SUS 304) at room temperature.

Measurements of 90-degree peeling strengths performed on the first test specimen and the second test specimen revealed that while a peeling strength of the tacky material layer 4 and the base material film 5 with respect to the adherend had an maximum value of 40 N/m in the first test specimen, a peeling strength of the tacky material layer 4 and the base material film 5 with respect to the adherend had a maximum value of 10 N/m in the second test specimen. From this result, it was confirmed that the formation of the notched parts 11 in the pasting region P contributes toward increasing the peeling strength of the wafer processing tape 1.

[Modifications]

Figure 7:
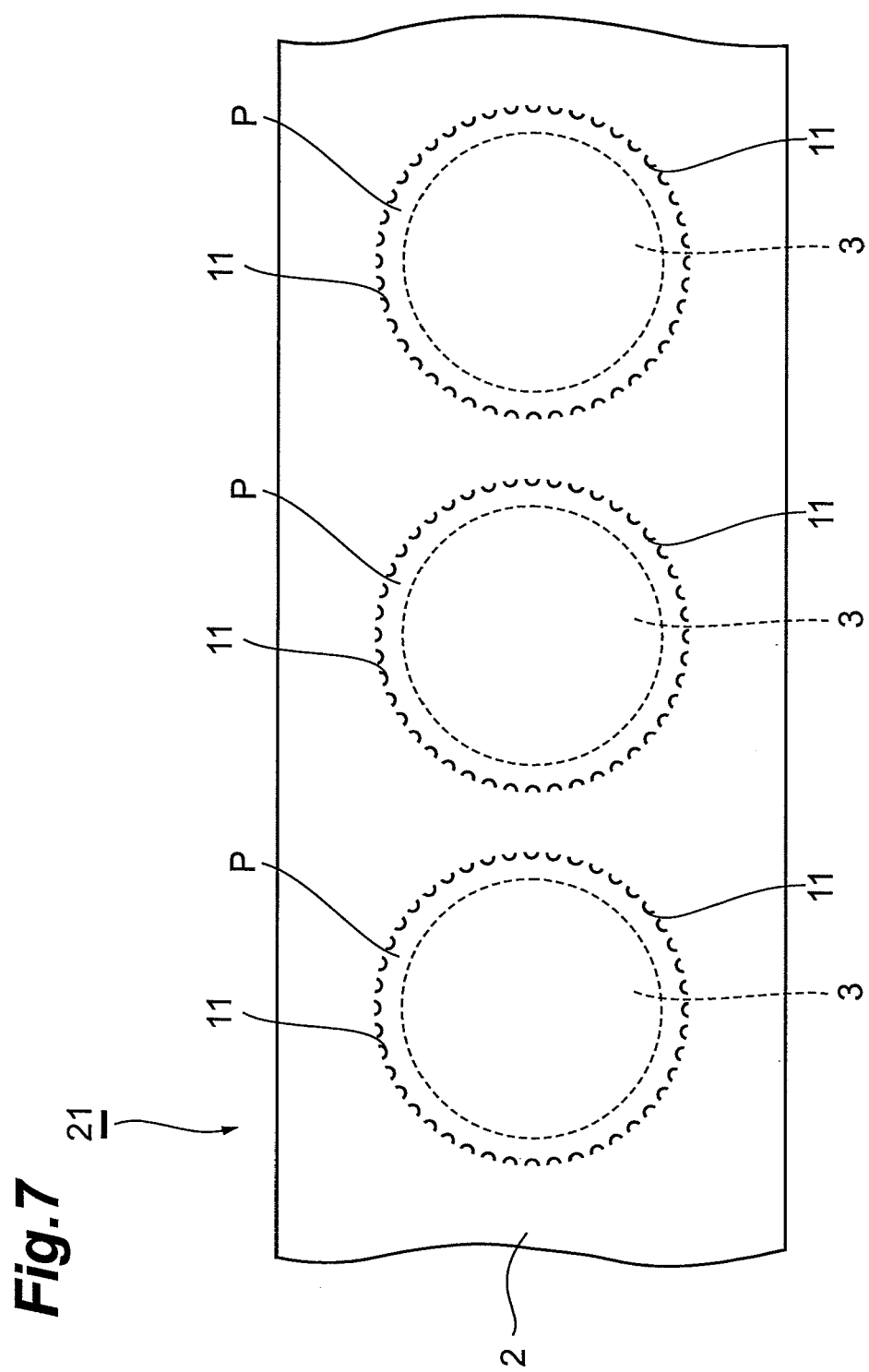
FIG. 7 is a plan view of a wafer processing tape according to a modification.

The present invention is not limited to the embodiment described above. For example, while the embankments 6 are formed by a circular pre-cutting process of the tacky film 17 in the embodiment described above, as shown in FIG. 7, a wafer processing tape 21 on which the embankments 6 are not formed may be adopted instead.

Figure 8:
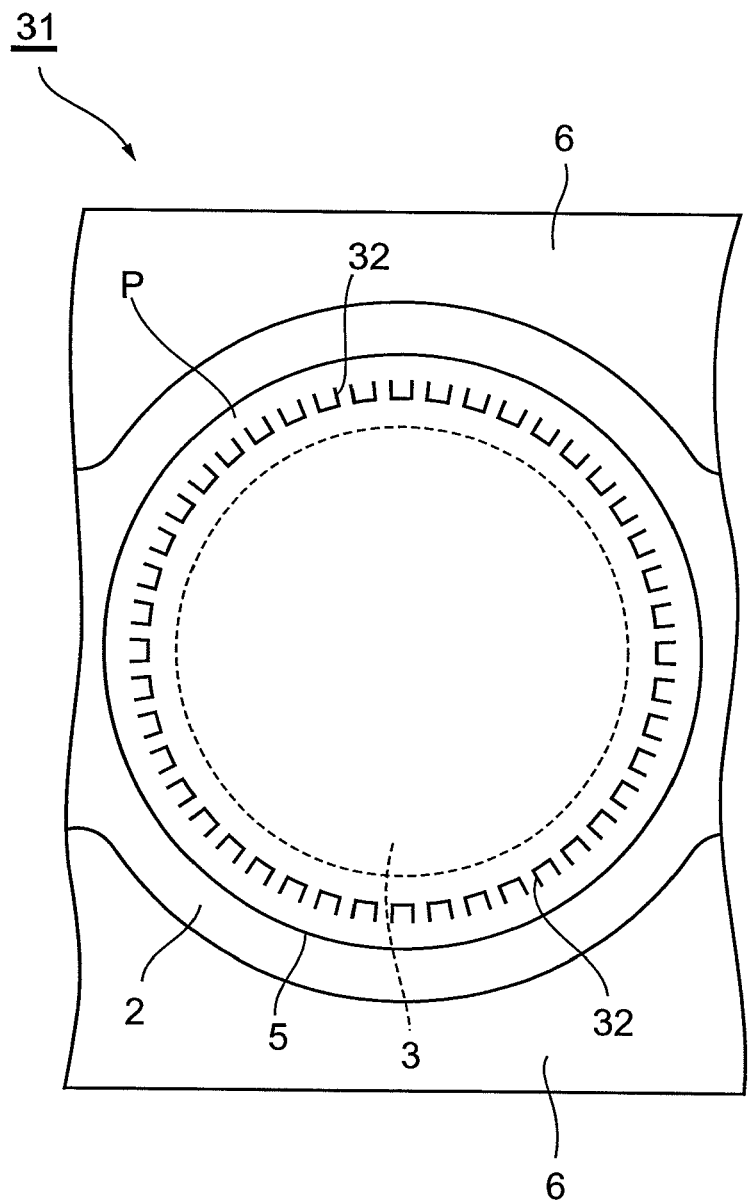
FIG. 8 is a plan view of a wafer processing tape according to another modification.
Figure 9:
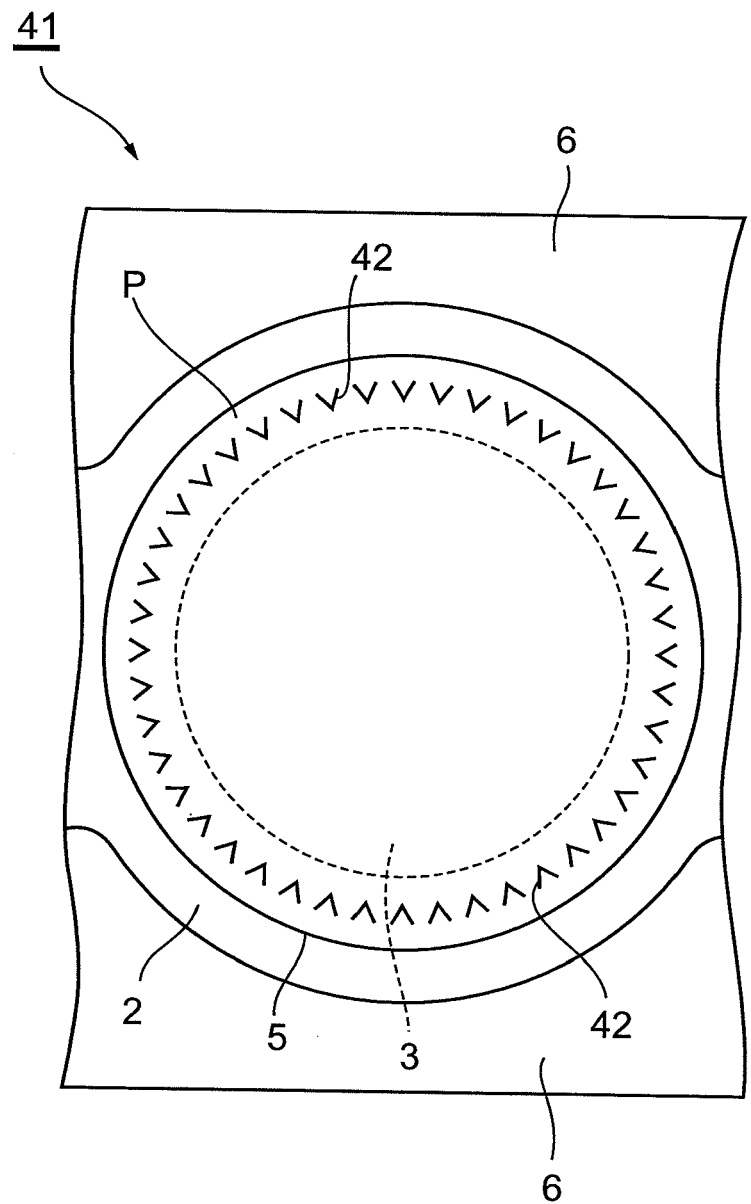
FIG. 9 is a plan view of a wafer processing tape according to yet another modification.

In addition, the notched parts need only be shaped so as to protrude toward the center of the adhesive layer 3 as seen in a plan view. As such, various modifications can be applied. For example, rectangular notched parts 32 may be formed as with a wafer processing tape 31 shown in FIG. 8, or notched parts 42 having approximate V-shapes may be formed as with a wafer processing tape 41 shown in FIG. 9.

Figure 10:
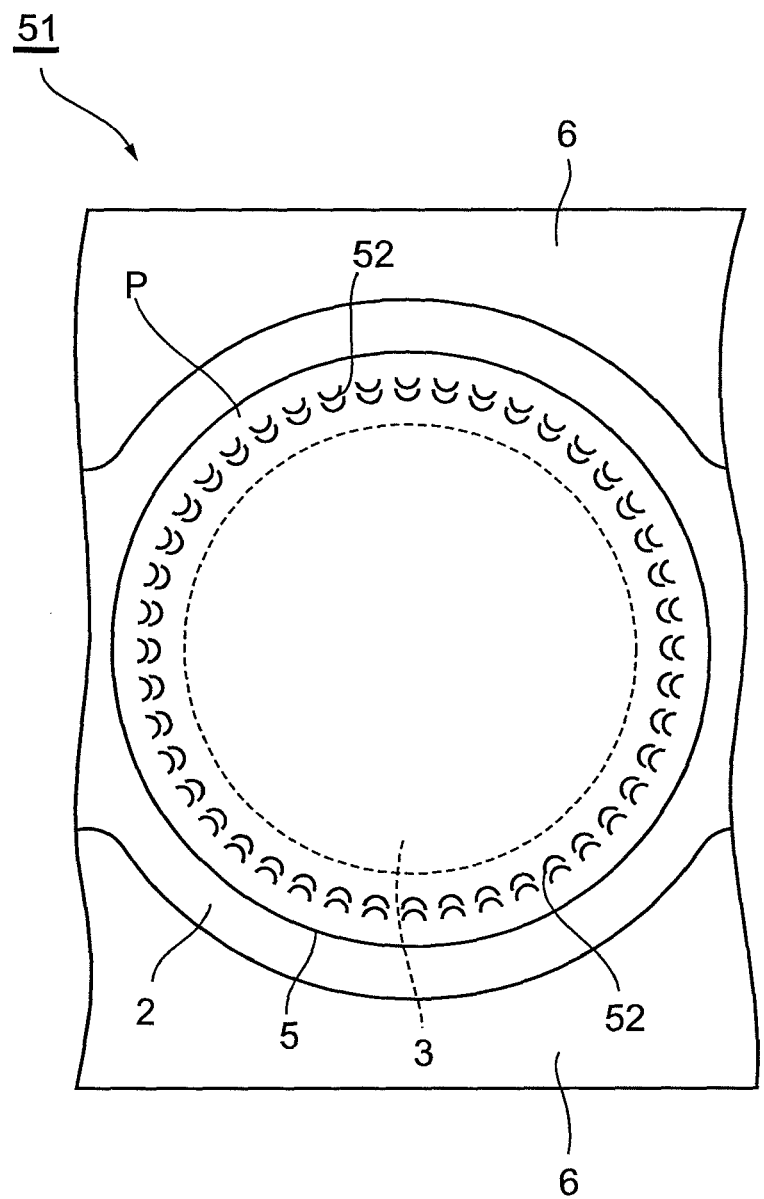
FIG. 10 is a plan view of a wafer processing tape according to yet another modification.
Figure 11:
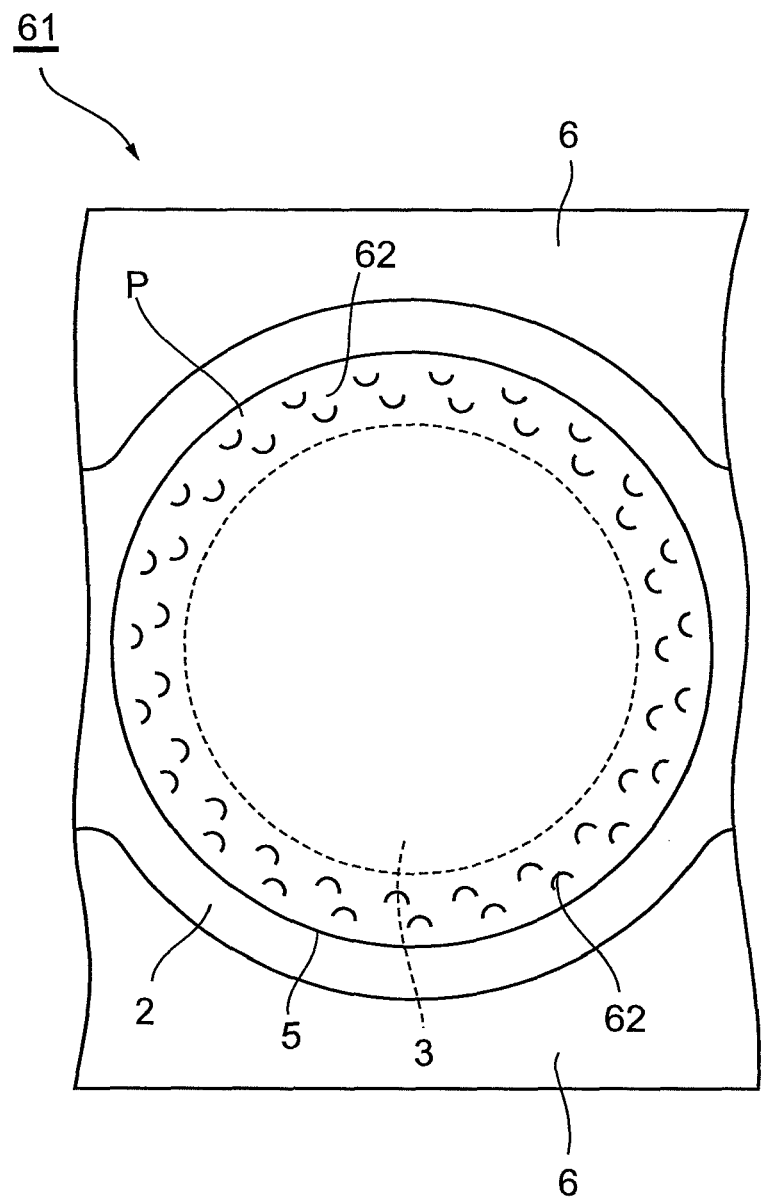
FIG. 11 is a plan view of a wafer processing tape according to yet another modification.
Figure 12:
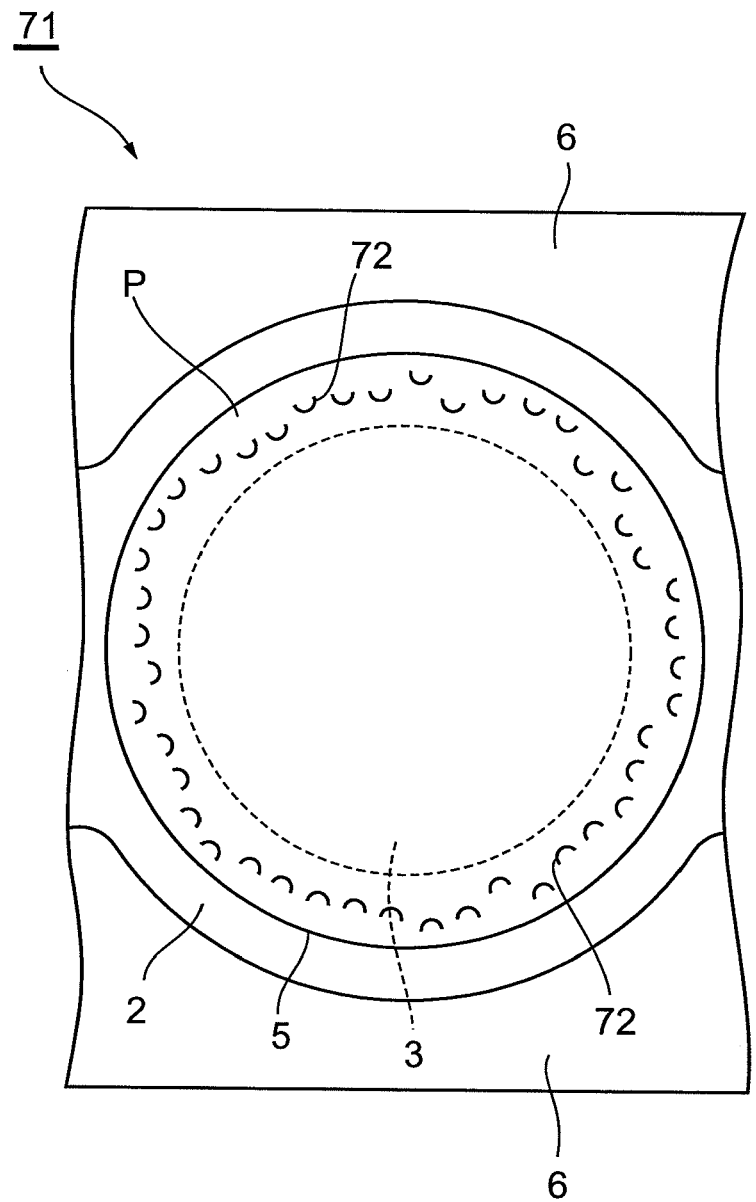
FIG. 12 is a plan view of a wafer processing tape according to yet another modification.

Furthermore, for example, circular or tongue-shaped notched parts 52 may be doubly formed as with a wafer processing tape 51 shown in FIG. 10, circular or tongue-shaped notched parts 62 may be formed staggered along two annular lines as with a wafer processing tape 61 shown in FIG. 11, or positions of notched parts 72 from the tacky material layer 4 and the base material film 5 may be set random for each notched part 72 as with a wafer processing tape 71 shown in FIG. 12.

Figure 13:
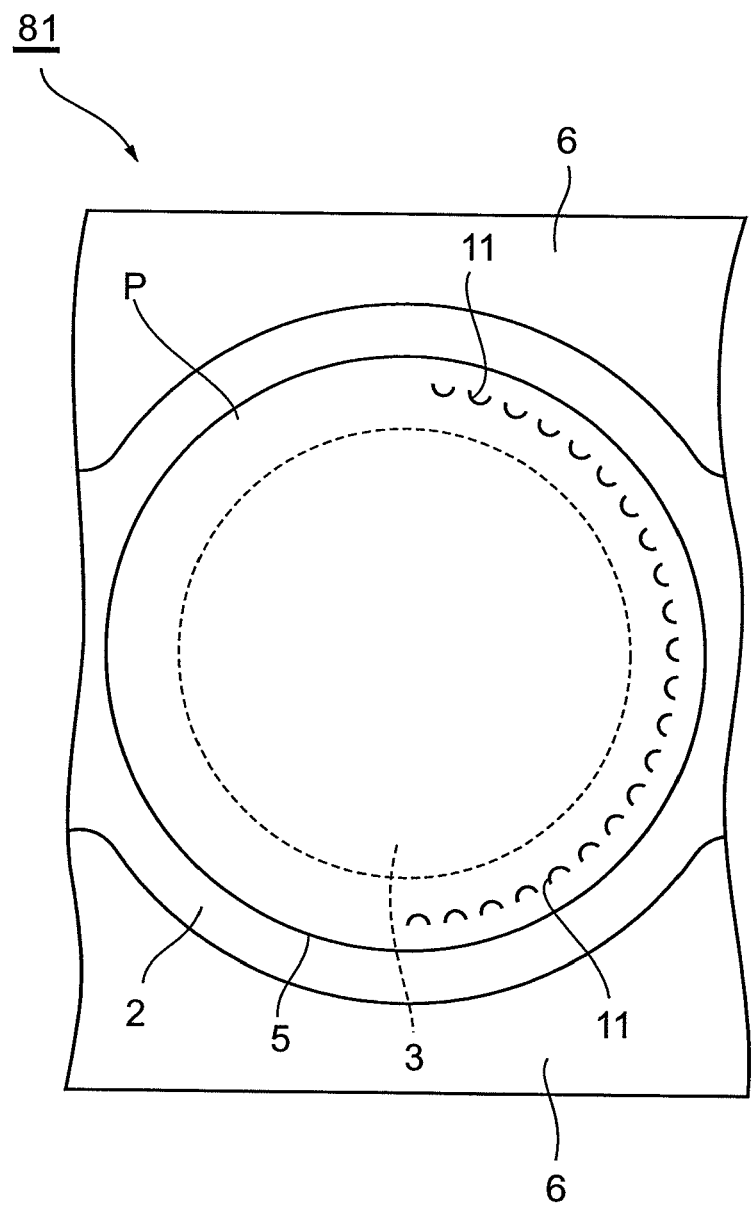
FIG. 13 is a plan view of a wafer processing tape according to yet another modification.

In addition, as with a wafer processing tape 81 shown in FIG. 13, notched parts 11 may be respectively formed only on one of the edges of the tacky material layer 4 and the base material film 5. Accordingly, when using the wafer processing tape 81, the release base material 2 can be easily peeled off from the side of the region in which the notched parts 11 are formed. Moreover, when using the wafer processing tape 81, cooling water 16 during dicing is favorably directed toward the region in which the notched parts 11 are formed.

Figure 14:
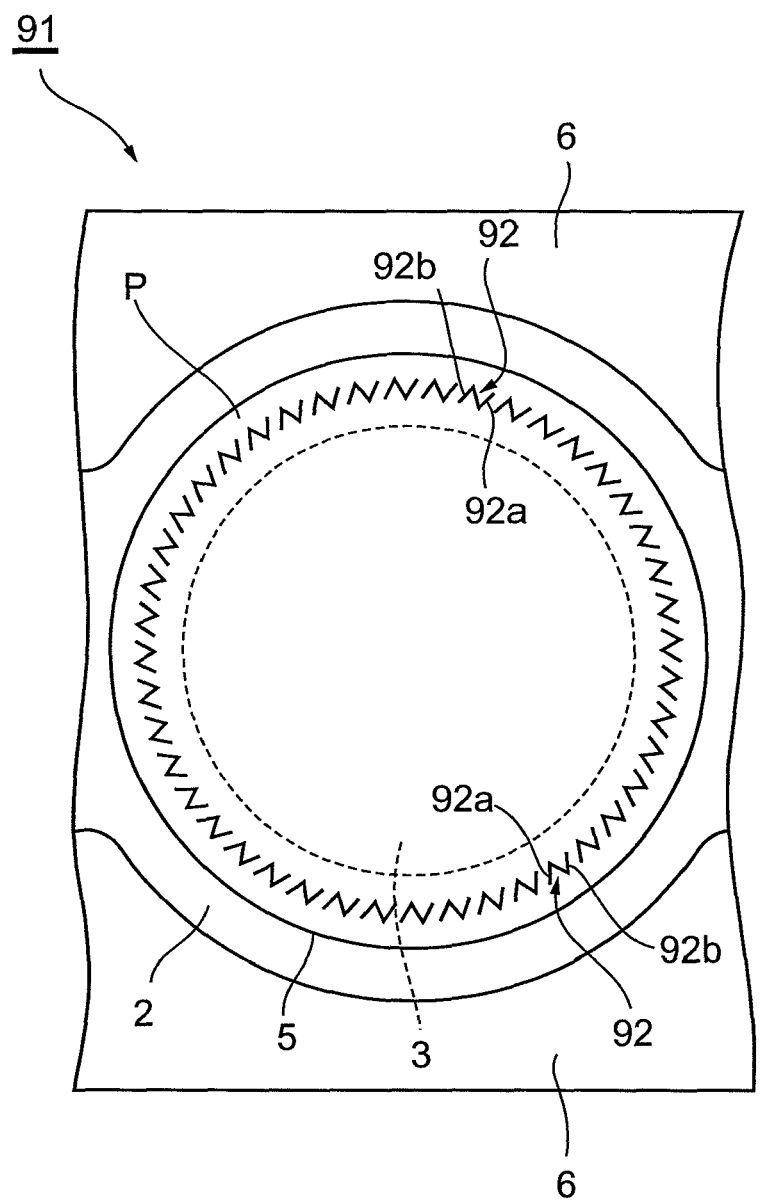
FIG. 14 is a plan view of a wafer processing tape according to yet another modification.
Figure 15:
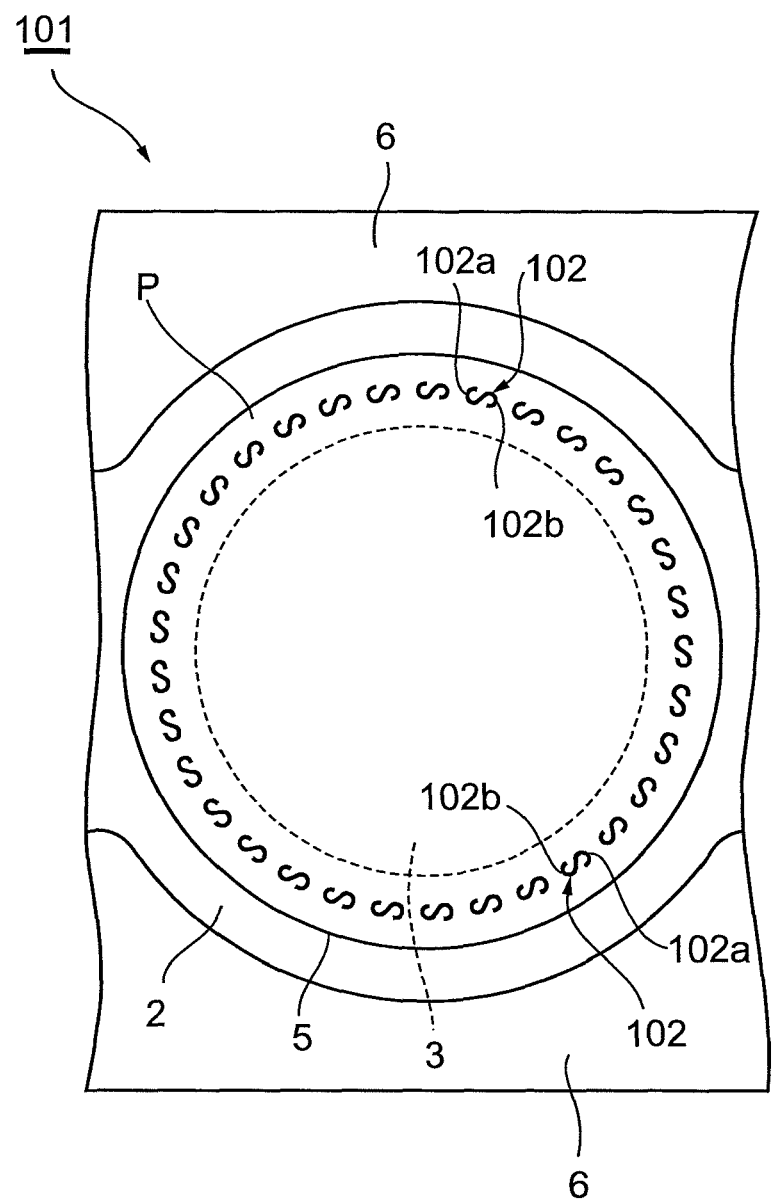
FIG. 15 is a plan view of a wafer processing tape according to yet another modification.
Figure 16:
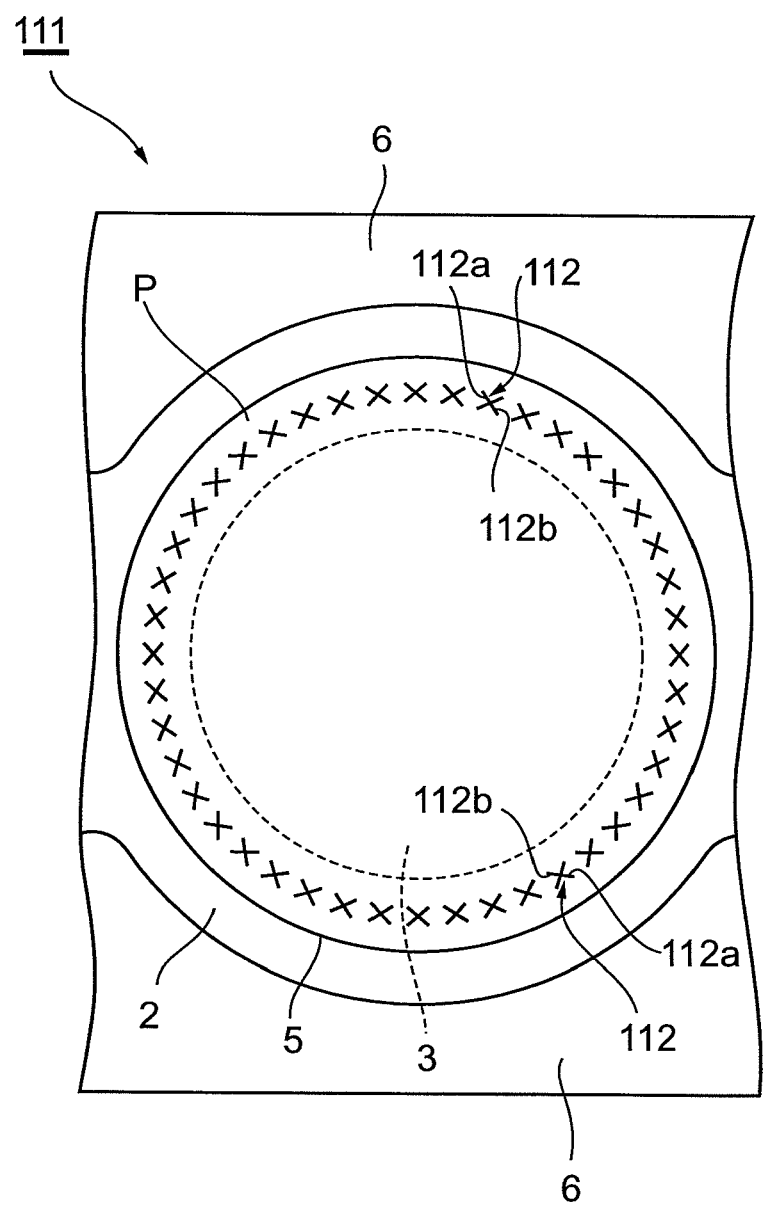
FIG. 16 is a plan view of a wafer processing tape according to yet another modification.

On the other hand, in addition to a protruding portion that faces the center of the adhesive layer 3 as seen in a plan view, a protruding portion that faces the outside of the adhesive layer 3 as seen in a plan view may be further formed on a notched part. For example, as with a wafer processing tape 91 shown in FIG. 14, a protruding portion 92*a* facing the center of the adhesive layer 3 and a protruding portion 92*b* facing the outside of the adhesive layer 3 may be arranged side by side in a circumferential direction of the adhesive layer 3 to form an approximately N-shaped notched part 92. In addition, according to a similar concept, an approximately S-shaped notched part 102 may be formed by a protruding portion 102*a* facing the center of the adhesive layer 3 and a protruding portion 102*b* facing the outside of the adhesive layer 3 as with a wafer processing tape 101 shown in FIG. 15. Furthermore, as with a wafer processing tape 111 shown in FIG. 16, a protruding portion 112*a* facing the center of the adhesive layer 3 and a protruding portion 112*b* facing the outside of the adhesive layer 3 may be arranged side by side in a radial direction of the adhesive layer 3 to form an approximately X-shaped notched part 112.

With such wafer processing tapes 91, 101, and 111, while inner portions of the notched parts 92, 102, and 112 remain on the wafer ring 14 in a protruding state at the protruding portions 92*a*, 102*a*, and 112*a* that face the center of the adhesive layer 3, inner portions of the notched parts 92, 102, and 112 are turned up at the protruding portions 92*b*, 102*b*, and 112*b* that face the outside of the adhesive layer 3, and cooling water 16 during dicing can be released to the outside of the wafer processing tapes 91, 101, and 111 from these portions. Therefore, the peeling strengths between the wafer processing tapes 91, 101, and 111 and the wafer ring 14 can be further ensured.

What is claimed is:

1. A wafer processing tape having a pasting region to be pasted to a wafer ring used when processing a semiconductor wafer, the wafer processing tape comprising:

a release base material constituting a base of the tape;

an adhesive layer provided on one surface of the release base material so as to correspond to a planar shape of the semiconductor wafer;

a tacky material layer provided so as to cover the adhesive layer; and a base material film provided so as to cover the tacky material layer, wherein:

in a plan view, regions of the tacky material layer and the base material film protruding outward from the adhesive layer serve as the pasting region to the wafer ring, in the plan view, at least one notched part is formed entirely outside the adhesive layer, in the base material film and the tacky material layer in the pasting region, to a depth reaching the release base material from the side of the base material film, the notched part being spaced inwardly from an outer perimeter of the pasting region, and in the plan view, a part of the tacky material layer and the base material film in the pasting region is partitioned by the notched part into:

(a) a first portion nearer than the notched part to the center of the adhesive layer, and (b) a second portion more distant than the notched part from the center of the adhesive layer but continuous with the first portion around the notched part, and having a flap bounded by the notched part so as to be embraced by the notched part and to protrude toward the center of the adhesive layer.

2. The wafer processing tape according to claim 1, wherein a plurality of said notched parts are arranged discontinuously from each other along the pasting region so as to define a plurality of said flaps.

3. The wafer processing tape according to claim 1, including at least one additional notched part formed entirely outside the adhesive layer and defining a flap that faces away from the outside of the adhesive layer, as seen in the plan view.

4. The wafer processing tape according to claim 1, wherein the at least one notched part does not penetrate the release base material.

5. The wafer processing tape according to claim 1, wherein the at least one notched part extends partially through the thickness of the release base material.

6. A wafer processing tape having a pasting region to be pasted to a wafer ring used when processing a semiconductor wafer, the wafer processing tape comprising:

a release base material constituting a base of the tape;

an adhesive layer provided on one surface of the release base material so as to correspond to a planar shape of the semiconductor wafer;
a tacky material layer provided so as to cover the adhesive layer; and
a base material film provided so as to cover the tacky material layer,
wherein:
in a plan view, regions of the tacky material layer and the base material film protruding outward from the adhesive layer serve as a pasting region to the wafer ring,
in the plan view, the pasting region includes a flap formed entirely outside the adhesive layer, spaced inwardly from an outer perimeter of the pasting region, defined by a notch part spaced inwardly from an outer perimeter of the pasting region, the flap and protruding toward a center of the adhesive layer, and
the flap extends to a depth reaching the release base material from the side of the base material film.

* * * * *